United States Patent [19]

Clavin

[11] Patent Number: 5,754,412
[45] Date of Patent: May 19, 1998

[54] CIRCUIT BOARD STANDOFF CONNECTOR

[75] Inventor: Timothy J. Clavin, Corona, Calif.

[73] Assignee: Hartwell Corporation, Placentia, Calif.

[21] Appl. No.: 539,326

[22] Filed: Oct. 4, 1995

[51] Int. Cl.[6] ................................................. H05K 1/14
[52] U.S. Cl. ............... 361/804; 174/138 D; 174/138 G; 174/166 S; 411/32; 411/45; 24/453
[58] Field of Search .................... 361/742, 804, 361/770; 174/138 D, 138 G, 166 S; 411/32, 45, 60, 508, 349, 549, 550, 553; 24/573.2, 453; D8/354

[56] References Cited

U.S. PATENT DOCUMENTS

| | | | |
|---|---|---|---|
| 3,811,154 | 5/1974 | Lindeman et al. | 361/804 |
| 3,836,704 | 9/1974 | Coules | 174/138 D |
| 4,007,516 | 2/1977 | Coules | 411/349 |
| 4,075,742 | 2/1978 | Remark et al. | 24/453 |
| 4,502,193 | 3/1985 | Harmon et al. | 174/138 D |
| 4,784,550 | 11/1988 | Wollar | 411/32 |
| 4,786,225 | 11/1988 | Poe et al. | 411/32 |
| 4,970,761 | 11/1990 | Nakamura | 174/138 D |
| 5,468,109 | 11/1995 | Ferrari et al. | 411/349 |

OTHER PUBLICATIONS

Four pages from Richo catalog entitled Circuit Board Hardware captioned: Circuit Board Stacking Spacers (CBSS); Studded Circuit Board Supports (SCBS/MSCBS); Reverse Locking Circuit Board Support. Pronged Round Hole (RLCBSPR); and Hex Spacer Standoffs (HS).

Five pages from catalog entitled Electrical/Electronic Components captioned: PC Board Support/Spacers; PC Board Supports Specials; PC Board Supports Specials (continued from previous page); Tandemount Supports; and Card Guides.

*Primary Examiner*—Leo P. Picard
*Assistant Examiner*—John B. Vigushin
*Attorney, Agent, or Firm*—Pretty, Schroeder & Poplawski

[57] ABSTRACT

A standoff connector for fastening two plates in spaced relation, including a body and a stud for insertion into the body. The body has a base and a trunk projecting upward from the base, and also has a central opening for receiving the stud, with a sleeve carried in the central opening with a plurality of spaced resilient fingers having upper ends fixed in the trunk and lower ends spaced from the trunk for outward radial movement, the lower ends of the fingers having inwardly directed tips for gripping the stud. The stud has a shaft for positioning in the body opening and a handle at one end for rotating the stud, with a shaft having a major diameter adjacent the other end and a minor diameter between the major diameter and the handle for receiving the tips of the body sleeve, with the body and stud having interengaging elements for limiting rotation of the stud in the body.

9 Claims, 3 Drawing Sheets

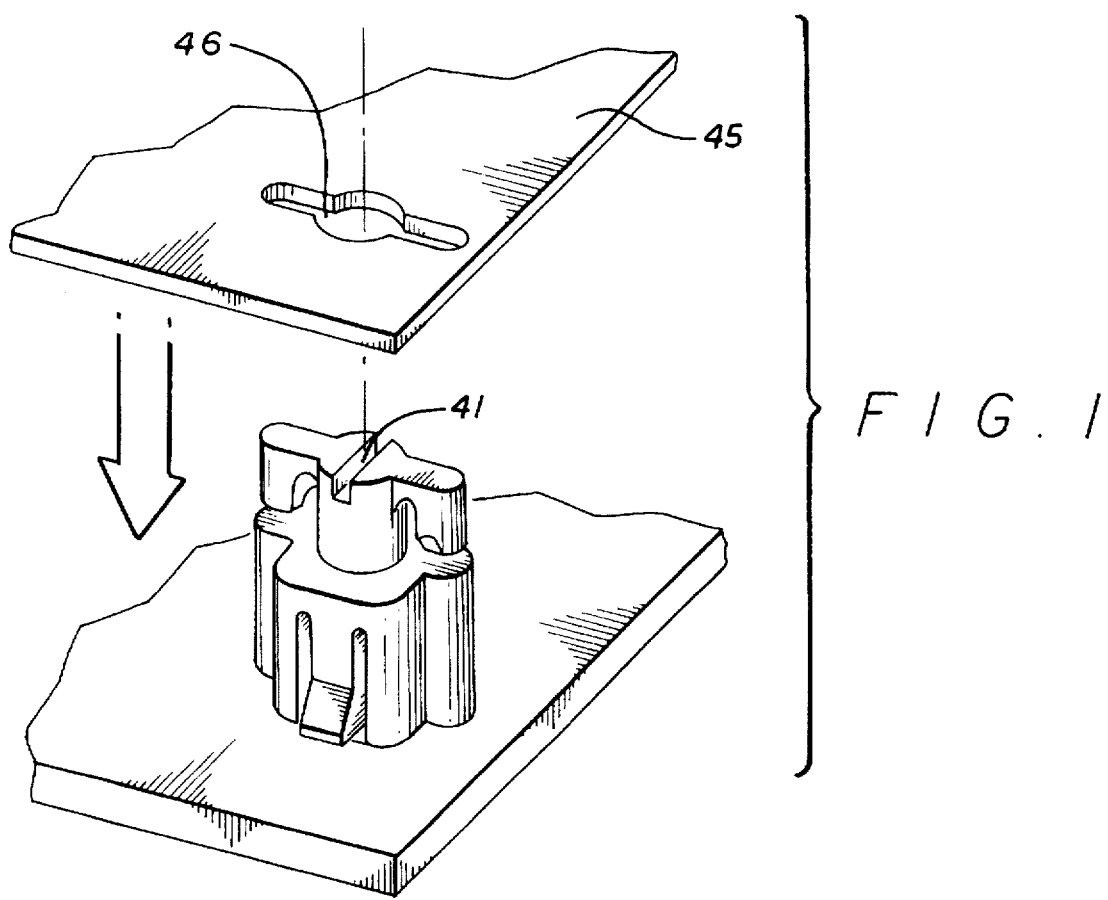
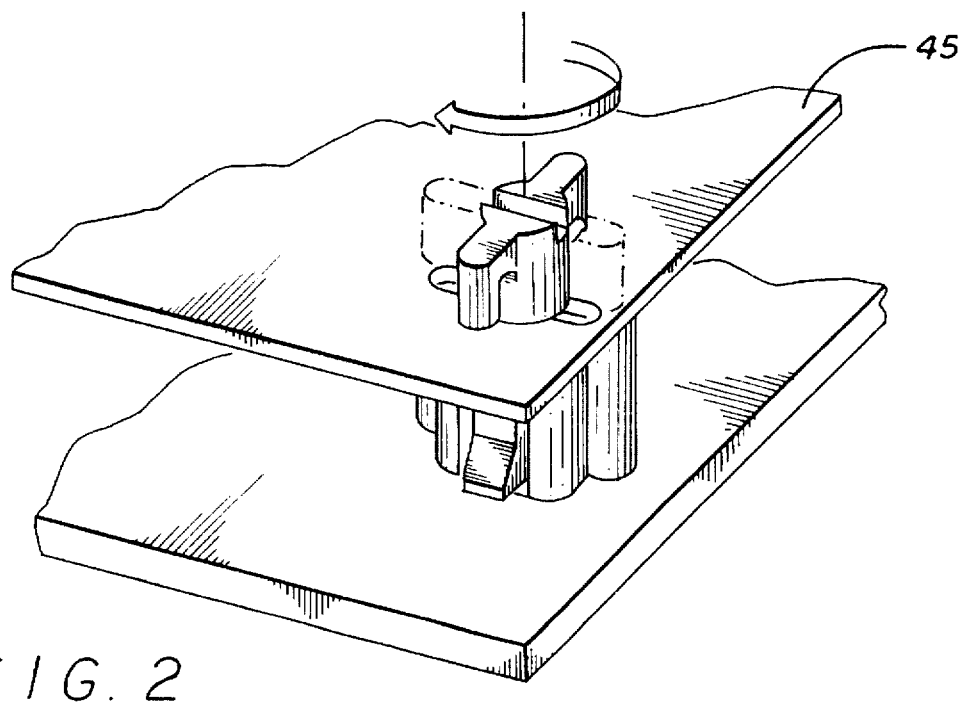
FIG. 1
FIG. 2

CIRCUIT BOARD STANDOFF CONNECTOR

BACKGROUND OF THE INVENTION

This invention relates to connectors for joining plates in spaced relation, such as two electronic circuit boards. Standoff connectors of this nature are widely used today, and a typical construction is shown in U.S. Pat. 4,786,225.

The purpose of the present invention is to provide a new and improved standoff connector having a number of features and advantages not encountered in prior art devices.

It is an object of the invention to provide a new and improved standoff connector comprising a body and a stud, each of which may be a molding, with the two parts being assembled without any tooling requirement, which parts do not require any assembly during installation with spaced plates or disassembly with separation of the spaced plates.

It is a particular object of the invention to provide such a standoff connector which has a very low profile, typically with a thin base on the body projecting from one plate in the order of 1 millimeter, and with a manually operable handle projecting from the other plate about 3 millimeters. If the handle is designed for operation with a tool rather than manually, this projection can be reduced to the order of 1–2 millimeters.

It is another object of the invention to provide such a standoff connector which can be popped into place in an opening in one of the panels, with the other panel positioned over the stud of the connector and positively locked in place by a quarter turn of the stud. At the same time, the second panel may be easily removed by rotating the handle a quarter turn in the opposite direction, permitting lifting of the panel off the connector.

It is a particular object of the invention to provide such a standoff connector which can be molded of plastic or of metal, as desired.

Other objects, advantages, features and results will more fully appear in the course of the following description.

SUMMARY OF THE INVENTION

The presently preferred embodiment of the standoff connector of the invention includes a body and a stud for insertion into the body, with the body having a base, an upwardly projecting trunk and having a central opening for receiving the stud. The body includes a sleeve carried in the central opening with a plurality of spaced resilient fingers having upper ends fixed in the trunk and lower ends spaced from the trunk for outward radial movement, the lower ends having inwardly directed tips for gripping the stud. The stud has a shaft for positioning in the body opening and a handle at one end for rotating the stud in the body, with a major diameter adjacent the other end of the stud and a minor diameter between the major diameter and the handle for receiving the tips. The body and stud also have interengaging elements for limiting rotation of the stud in the body.

BRIEF DESCRIPTION OF THE DRAWINGS

FIG. 1 is a perspective view illustrating the presently preferred embodiment of the standoff connector mounted in a lower plate, with the upper plate positioned above the connector prior to assembly;

FIG. 2 is a view like FIG. 1, with the upper plate now in position on the connector and locked in place by rotation of the connector handle;

DESCRIPTION OF THE PREFERRED EMBODIMENT

Figure 4:
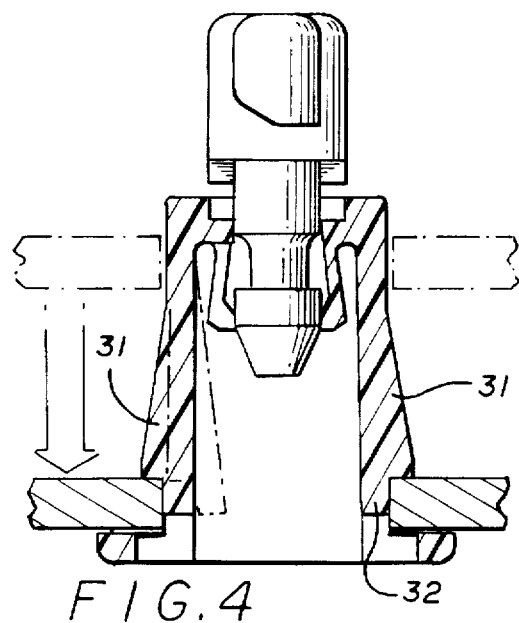
FIG. 4 is an enlarged vertical sectional view showing the body inserted in the lower plate and the stud partially inserted into the body.

The connector of the invention includes a body 11 and a stud 12 for sliding insertion into the body. The body has a base 13, relatively thin, and a trunk 14 projecting upward from the base, with a central opening 15 for receiving the stud 12. A sleeve 16 is formed within the body and has a plurality of resilient fingers 17, typically three. The upper ends of the fingers are affixed in the trunk of the body, and the lower ends of the fingers are spaced from the trunk permitting outward flexing in a radial direction, such as is seen in FIG. 4. Preferably, the lower ends of the fingers 17 have inwardly directed tips 18 for gripping engagement with the stud 12.

Figure 5:
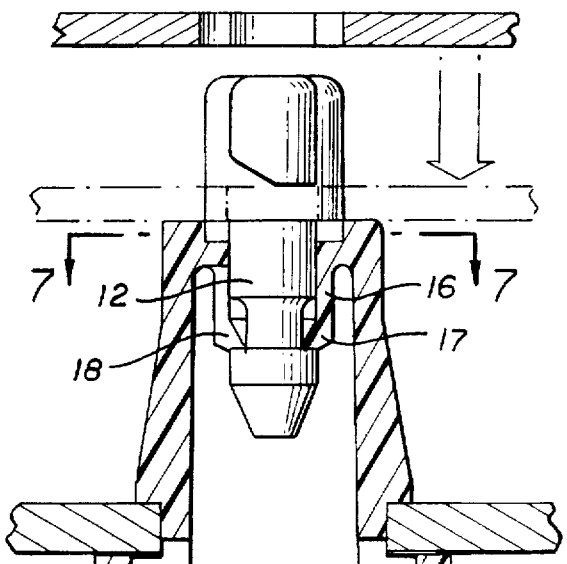
FIG. 5 is a view similar to that of FIG. 4 showing the stud fully inserted into the body and the upper plate ready for positioning over the handle.

The stud 12 has a shaft 19 and a handle 20 at the upper end of the stud, for rotating the stud in the body. The stud has a major diameter 21 adjacent the other end of the stud, and a minor diameter 22 between the diameter 21 and the handle, for receiving the tips of the fingers, as seen in FIG. 5. The end 23 of the stud preferably is tapered for easy insertion into the sleeve 16.

Figure 6:
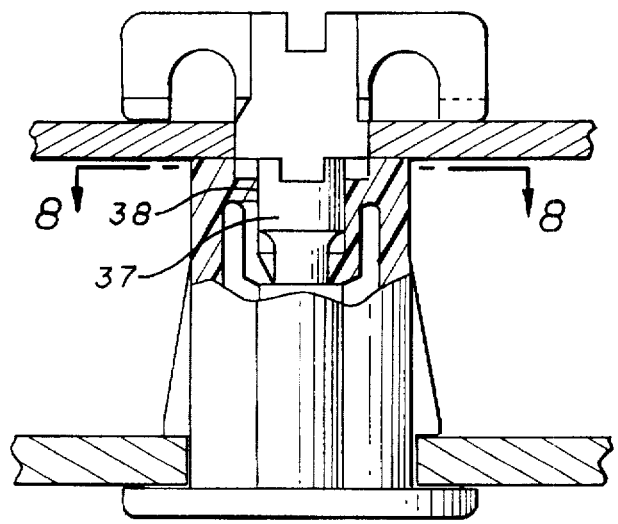
FIG. 6 is a view similar to FIGS. 4 and 5 showing the connector completely installed on the lower and upper plates.
Figure 7:
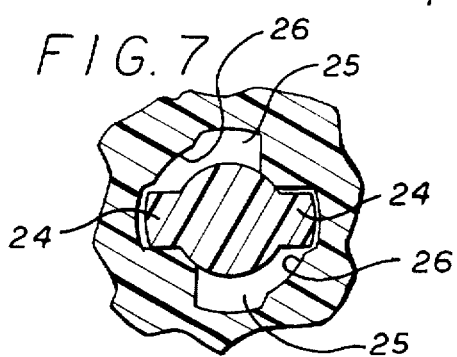
FIG. 7 is a sectional view taken along the line 7—7 of FIG. 5.
Figure 8:
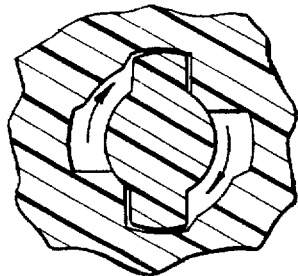
FIG. 8 is a similar sectional view taken along the line 8—8 of FIG. 6.

The body and the stud have interengaging elements for limiting rotation of the stud in the body, these preferably being opposed bosses 24 on the stud and opposed arcuate openings 25 in the upper end of the body. Preferably, inwardly projecting locking detents 26 are provided in the openings 25, as best seen in FIGS. 7 and 8, tending to maintain the stud in the assembled position of FIGS. 6 and 8.

Figure 3:
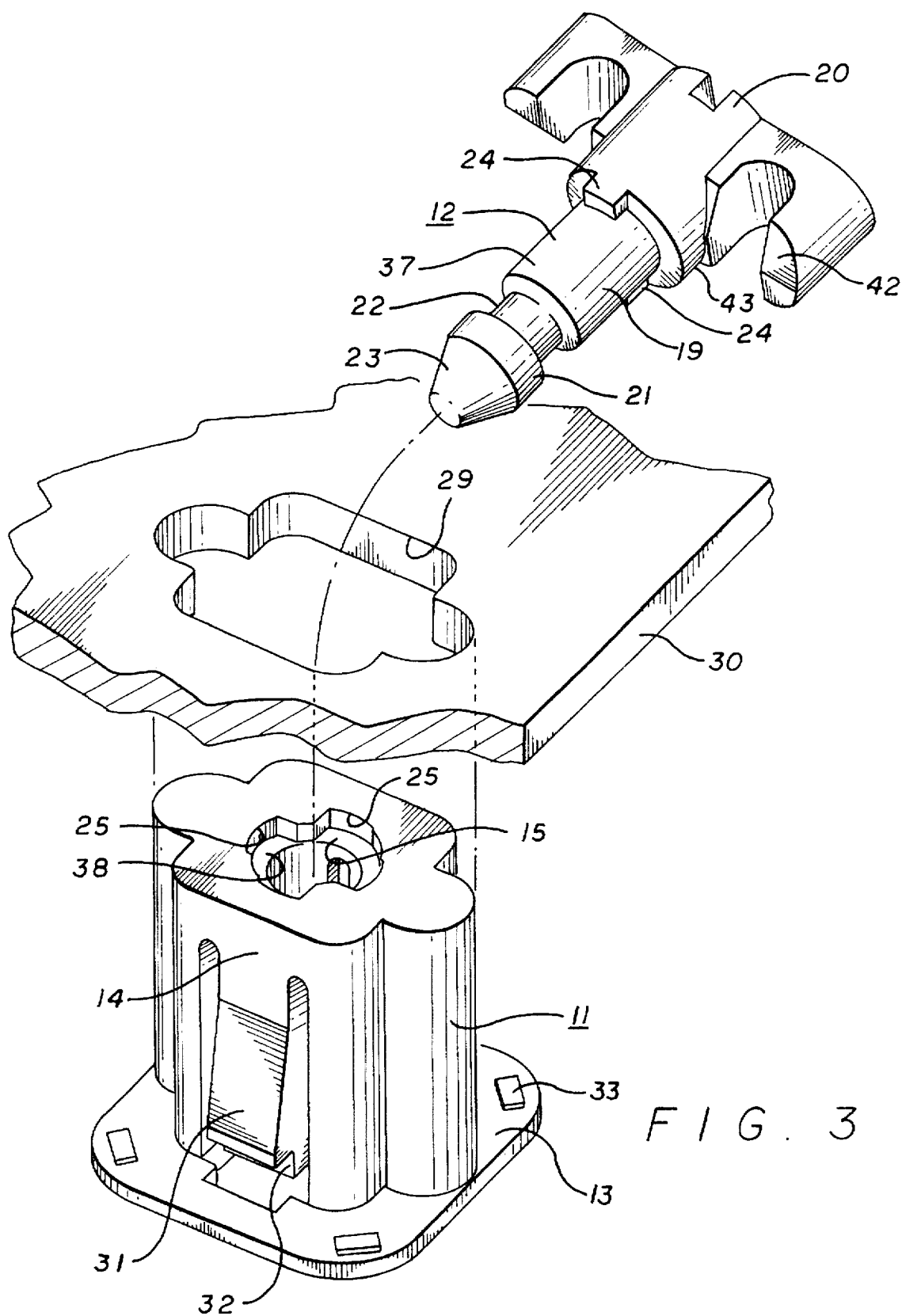
FIG. 3 is an exploded view of the connector of FIGS. 1 and 2, showing the body prior to insertion into the lower plate and the stud prior to insertion into the body.

As seen in FIG. 3, an opening 29 is provided in the lower panel 30 for receiving the trunk 14 of the body 11. The trunk is made noncircular so that it will not rotate in the opening in the panel. The body is inserted into the panel 30 by pushing upward through the opening 29, with the base 13 limiting upward movement.

Opposed flexible cantilever snap lugs 31 are carried on opposite sides of the body, and are squeezed inward as the body trunk is pushed into the panel. The lugs then pop-out into place as seen in FIGS. 4-6, locking the body in the panel. The body may be removed by manually squeezing the lugs inward, as shown in dash lines in FIG. 4 for removing the body from the panel. Tabs 32 are provided at the lower ends of the lugs 31 and provide an audible click when the body is properly installed in the panel. The tabs also act to prevent the lugs from collapsing in the event the connector is pushed from the top side. Pads 33 may be positioned on the upper surface of the base to provide some preload on the canilever lugs, because the base may be slightly deflected to allow the canilever lugs to detent into position.

Referring to the resilient fingers 17 of the inner sleeve of the body, sharp corners preferably are provided on the bottom of the tips 18 for improved stud retention. Also, preferably a five degree undercut is provided on the tips to cause the sleeve to grip the stud tighter if the stud is pulled. The main body diameter 37 of the stud is sized to be supported in the opening 38 of the body for improved stability of the connector.

The handle 20 of the stud preferably is T-shaped for ease of manual operation, but could have other configurations. If desired, a screwdriver slot 41 (see FIG. 1) or other tool receiving slot could be provided in the handle for rotation of the stud. This would permit the handle to be made substantially thinner. Preferably, ramps 42 are provided on the lead end side of the T-shaped handle, to allow for easy starting of rotation of the handle and taking up any slop which may be exist between the upper panel and the body. Desirably, additional protrusions 43 are provided on the stud at the main diameter for increased hold down performance.

In use, the stud is inserted into the body to the condition of FIG. 5. The connector is then inserted upward into the lower panel 30 through the opening 29. Then when it is desired to attach the upper panel to the lower panel, the upper panel 45 which has a clearance opening 46 for the handle, is placed over the handle to rest on the upper end of the body. The handle is rotated a quarter turn, as shown in FIG. 2, thereby locking the second panel in place, spaced from the first panel. After the handle is rotated to lock the panels together, with the bosses 24 moving past the detents 26, to the position of FIG. 8, the detents also act to reduce the likelihood of the connector loosening during vibration.

The upper panel is removed by a reverse process. The stud handle is rotated a quarter turn in the opposite direction and the upper panel may be lifted from the connector. Also as previously mentioned, the connector may be removed from the lower panel by inward pressure on the cantilever lugs 31.

Thus, it is seen that the standoff connector of the invention provides the many desired advantages of a standoff connector, particularly the low profile in both the lower panel and the upper panel. Also, the connector itself does not have to be disassembled in order to connect panels or disconnect panels or remove the connector from a panel. This permits the connector to be removed and reused as desired.

I claim:

1. A standoff connector for fastening two plates in spaced relation, including:

a body; and a stud for insertion into said body;

said body having a base and a trunk projecting upward from said base, said body having a central opening for receiving said stud, said body having a sleeve carried entirely within said central opening with a plurality of spaced resilient fingers, said fingers having upper ends fixed in said trunk and lower ends spaced from said trunk for outward radial movement, said lower ends having inwardly directed tips for gripping said stud;

said stud having a shaft for positioning in said body opening and a handle at one end for rotating said stud in said body, said stud having a major diameter adjacent the other end of said stud and a minor diameter between said major diameter and said handle for receiving said tips of said body sleeve, and with said stud shaft of a limited length so that said stud shaft is entirely within said body central opening;

said body and stud having interengaging elements for limiting rotation of said stud in said body.

2. A standoff connector for fastening two plates in spaced relation, including:

a body; and a stud for insertion into said body;

said body having a base and a trunk projecting upward from said base, said body having a central opening for receiving said stud, said body having a sleeve carried entirely within said central opening with a plurality of spaced resilient fingers, said fingers having upper ends fixed in said trunk and lower ends spaced from said trunk for outward radial movement, said lower ends having inwardly directed tips for gripping said stud;

said stud having a shaft for positioning in said body opening and a handle at one end for rotating said stud in said body, said stud having a major diameter adjacent the other end of said stud and a minor diameter between said major diameter and said handle for receiving said tips of said body sleeve;

said body and stud having interengaging elements for limiting rotation of said stud in said body, with said body having a flat base and opposed resilient lugs, with the free ends of the lugs adapted for gripping a plate between said base and said lugs.

3. A connector as defined in claim 2 wherein each of said lugs is notched at its free end for engagement with the rim of the opening in the plate.

4. A connector as defined in claim 3 wherein said interengaging elements include opposed projections on said stud shaft and means defining opposed arcuate openings in said body trunk, said openings have stops for limiting axial insertion of said stud into said body.

5. A connector as defined in claim 4 including locking detents in said arcuate openings for maintaining said stud in the installed position, and including thin pads spaced about the upper surface of said body base.

6. A connector as defined in claim 5 wherein said stud handle includes means defining pressure grips for applying pressure to a panel positioned between said handle and said body.

7. A standoff connector for fastening two plates in spaced relation, including:

a body; and a stud for insertion into said body;

said body having a base and a trunk projecting upward from said base, said body having a central opening for receiving said stud, said body having a sleeve carried entirely within said central opening with a plurality of spaced resilient fingers, said fingers having upper ends fixed in said trunk and lower ends spaced from said trunk for outward radial movement, said lower ends having inwardly directed tips for gripping said stud;

said stud having a shaft for positioning in said body opening and a handle at one end for rotating said stud in said body, said stud having a major diameter adjacent the other end of said stud and a minor diameter between said major diameter and said handle for receiving said tips of said body sleeve;

said body and stud having interengaging elements for limiting rotation of said stud in said body, with said interengaging elements including opposed projections on said stud shaft and means defining opposed arcuate openings in said body trunk, said openings having stops for limiting axial insertion of said stud into said body.

8. A connector as defined in claim 7 including locking detents in said arcuate openings for maintaining said stud in the installed position, and including thin pads spaced about the upper surface of said body base.

9. A connector as defined in claim 8 wherein said stud handle includes means defining pressure grips for applying pressure to a panel positioned between said handle and said body.

* * * * *